(12) United States Patent
Iwahashi et al.

(10) Patent No.: US 9,691,642 B2
(45) Date of Patent: Jun. 27, 2017

(54) DEVICE FOR MEASURING UNDULATION OF BRAKE DISC IN RAILWAY WHEEL WITH BRAKE DISCS

(75) Inventors: Toru Iwahashi, Tokyo (JP); Naoto Kouchi, Osaka (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days.

(21) Appl. No.: 14/374,341

(22) PCT Filed: Sep. 14, 2012

(86) PCT No.: PCT/JP2012/005888
§ 371 (c)(1),
(2), (4) Date: Jul. 24, 2014

(87) PCT Pub. No.: WO2013/111209
PCT Pub. Date: Aug. 1, 2013

(65) Prior Publication Data
US 2014/0352417 A1   Dec. 4, 2014

(30) Foreign Application Priority Data

Jan. 27, 2012   (JP) ................................ 2012-015661

(51) Int. Cl.
*H01L 21/67* (2006.01)
*H01L 21/02* (2006.01)
(Continued)

(52) U.S. Cl.
CPC .......... *H01L 21/67051* (2013.01); *B05B 3/18* (2013.01); *B05B 15/1203* (2013.01);
(Continued)

(58) Field of Classification Search
CPC ......... H01L 21/67051; F16D 2055/005; G01B 5/0028
(Continued)

(56) References Cited

U.S. PATENT DOCUMENTS 6,233,533 B1 *  5/2001  Xu ........................ G01R 31/302
                                                              701/70
6,499,347 B1 * 12/2002  Kugel ..................... B60T 1/065
                                                              188/73.2
(Continued)

FOREIGN PATENT DOCUMENTS

TW         201007118       2/2010

*Primary Examiner* — Michael A Lyons
*Assistant Examiner* — Jean Morello
(74) *Attorney, Agent, or Firm* — Clark & Brody

(57) ABSTRACT

A device for measuring undulation of a brake disc in a railway wheel with brake discs includes a wheel support supporting a hub's bore of the railway wheel; a first displacement gauge for measuring a height displacement of the brake disc frictional surface for one round to follow rotation of the wheel support; and a second displacement gauge for measuring a height displacement of a railway wheel rim surface for one round to follow rotation of the wheel support. A computing unit calculates a difference between maximum and minimum values of the height displacement of the frictional surface by acquiring measurement data from the first displacement gauge, calculates a difference between the maximum and minimum values of the height displacement of the rim's surface by acquiring measurement data from the second displacement gauge, and derives a difference between the both calculated differences as brake disc undulation.

4 Claims, 1 Drawing Sheet

(51) Int. Cl.
| | |
|---|---|
| B61H 5/00 | (2006.01) |
| G01B 11/30 | (2006.01) |
| G01B 21/20 | (2006.01) |
| B60B 17/00 | (2006.01) |
| F16D 65/12 | (2006.01) |
| B05B 3/18 | (2006.01) |
| B05B 15/12 | (2006.01) |
| B05C 9/06 | (2006.01) |
| B05C 11/10 | (2006.01) |
| B05D 1/02 | (2006.01) |
| B08B 3/04 | (2006.01) |
| B60T 17/22 | (2006.01) |
| F16D 66/00 | (2006.01) |
| F16D 65/02 | (2006.01) |

(52) U.S. Cl.
CPC ............ *B05C 9/06* (2013.01); *B05C 11/1039* (2013.01); *B05C 11/1044* (2013.01); *B05D 1/02* (2013.01); *B08B 3/04* (2013.01); *B60B 17/00* (2013.01); *B60B 17/0068* (2013.01); *B60T 17/221* (2013.01); *B61H 5/00* (2013.01); *F16D 65/12* (2013.01); *F16D 66/00* (2013.01); *G01B 11/306* (2013.01); *G01B 21/20* (2013.01); *H01L 21/02057* (2013.01); *B60B 2900/325* (2013.01); *F16D 2065/138* (2013.01); *F16D 2065/1392* (2013.01); *F16D 2066/006* (2013.01)

(58) Field of Classification Search
USPC .................................. 73/121, 129; 188/73.35
See application file for complete search history.

(56) References Cited

U.S. PATENT DOCUMENTS

| | | | |
|---|---|---|---|
| 7,437,917 B1* | 10/2008 | McNaughton ....... | G01B 5/0028 73/121 |
| 2011/0184682 A1* | 7/2011 | Oishi .................. | H01R 13/641 702/82 |

* cited by examiner

DEVICE FOR MEASURING UNDULATION OF BRAKE DISC IN RAILWAY WHEEL WITH BRAKE DISCS

TECHNICAL FIELD

The present invention relates to a device for measuring the undulation of a brake disc in a railway wheel with brake discs mounted on a railway vehicle.

BACKGROUND ART

A disc brake has been hitherto employed as a braking device for a railway vehicle. As the disc brake, a railway wheel (hereinafter, also simply "wheel") with brake discs (hereinafter, also simply "discs") configured so that the discs are mounted on both side surfaces of the wheel respectively is frequently used.

FIG. 1 is a cross-sectional view of an ordinary wheel with discs. The wheel with discs shown in FIG. 1 is configured to include a wheel 1, a pair of discs 2 each in the form of a doughnut disc, and bolts 3 and nuts 4 for fastening these discs 2. A front surface of each of the paired discs 2 serves as a frictional surface 2e, and a plurality of cooling fin portions 2a are formed radially on a rear surface of the disc 2. Bolt holes 1b and 2b into which the bolts 3 are inserted are formed in a flat web 1a of the wheel 1 and the discs 2, respectively. The paired discs 2 of the wheel with discs are arranged to face each other across the web 1a of the wheel 1, and the discs 2 are fastened to the wheel 1 by the bolts 3 inserted into the bolt holes 1b and 2b and the nuts 4 in a state in which the cooling fin portions 2a are in contact with the web 1a of the wheel 1.

At a time of assembling the wheel with discs configured as described above, the entry of a foreign object between the wheel 1 and each disc 2 should be avoided. If such a thing occurs, the disc 2 undulates to follow the rotation of the wheel 1 while the railway vehicle is running since the disc 2 is attached obliquely to the wheel 1 with discs 2. If the undulation of the disc 2 is extremely large, then the contact state between the frictional surface 2e of the disc 2 and a brake lining becomes unstable during braking, and braking performance possibly degrades. Owing to this, it is necessary to make management of the height-direction undulation of the discs 2 mounted on the wheel 1 in the wheel with discs, and the measurement of the undulation of the frictional surface 2e of the disc has been hitherto carried out.

The measurement of the undulation of the frictional surface 2e of the disc in the wheel with discs has been hitherto made manually using a dial gauge with a lug fixed to a dedicated gauge stand. That is, in a state in which the wheel with discs is mounted horizontally on a measurement table, the gauge stand is arranged on a rim's surface 1e of the wheel on an upper surface side with the rim's surface 1e set as a reference surface while contacting a gauge head of the gauge with the frictional surface 2e of the disc 2 on the upper surface side of the wheel. From this state, while attention is paid to the index of the gauge, the gauge stand is made to slide on the rim's surface 1e by one or more rounds, and maximum and minimum scales of fluctuations in the gauge index are read. The difference between both of the read scales is calculated manually and the calculated value is grasped as the undulation of the frictional surface 2e of the disc.

If the undulation of the frictional surface 2e of the disc on a lower surface side is to be measured, then the wheel with discs is vertically inverted by a crane or a special inverting machine, the frictional surface 2e of the disc on the lower surface side is re-arranged on the upper surface side, and then the undulation is measured by the dial gauge similarly to the above. The reason for the rearrangement is difficulty to slide the gauge stand on the rim's surface 1e turned downward and to read the gauge index if the measurement target disc 2 is kept arranged on the lower surface side.

SUMMARY OF INVENTION

Technical Problem

With the conventional undulation measuring method, it is possible to measure the undulation of the frictional surface of the disc by and large. However, the conventional undulation measuring method inevitably entails the proficient experience, concentration, and lots of time and labor since all the measurements are made manually and an operator needs to carefully slide the gauge stand on the rim's surface and, at the same time, to pay attention to the gauge index. If both of the paired discs are measured, heavier burden is imposed on the operator.

The present invention has been made in light of the above problems, and an object of the present invention is to provide an undulation measuring device capable of relaxing constraints on operator's experience and concentration and swiftly making measurement at a time of measuring the undulation of a frictional surface of a brake disc in a railway wheel with brake discs.

Solution to Problem

In order to achieve the above object, a device for measuring undulation according to the present invention is a device for measuring undulation of a brake disc in a railway wheel with brake discs, a pair of brake discs being arranged to face each other across a web of a railway wheel, the brake disc being fastened to the railway wheel by bolts, the device including:

a wheel support supporting a hub's bore of the railway wheel, and rotating about a central axis of the railway wheel;

a first displacement gauge provided to face a frictional surface of one of the brake discs, and measuring a height displacement of the frictional surface for one round to follow rotation of the wheel support;

a second displacement gauge provided to face a rim's surface of the railway wheel on a side of the frictional surface, and measuring a height displacement of the rim's surface for one round to follow the rotation of the wheel support; and a computing unit calculating a difference between a maximum value and a minimum value of the height displacement of the frictional surface by acquiring measurement data from the first displacement gauge, calculating a difference between a maximum value and a minimum value of the height displacement of the rim's surface by acquiring measurement data from the second displacement gauge, and deriving a difference between the both calculated differences as undulation of the brake disc.

In the above device for measuring undulation of a brake disc in a railway wheel with brake discs, pairs of the first displacement gauge and the second displacement gauge are preferably provided on the frictional surface side of one of the brake discs of the railway wheel supported by the wheel support and the frictional surface side of the other brake disc, respectively.

In the above device for measuring undulation of a brake disc in a railway wheel with brake discs, the first displacement gauge and the second displacement gauge are preferably reflective laser displacement sensors.

Advantageous Effects of Invention

The undulation measuring device according to the present invention drives the wheel support that supports the wheel with discs to rotate, and can derive the undulation of the frictional surface of the disc by the use of the computing unit on the basis of the measurement data measured by the first displacement gauge and the second displacement gauge to follow the rotation of the wheel support. Therefore, it is possible to swiftly measure the undulation without forcing the operator to have proficient experience and concentration.

DESCRIPTION OF EMBODIMENTS

Hereinafter, embodiments of the device for measuring undulation of a brake disc in a wheel with discs according to the present invention are described in detail.

Figure 1:
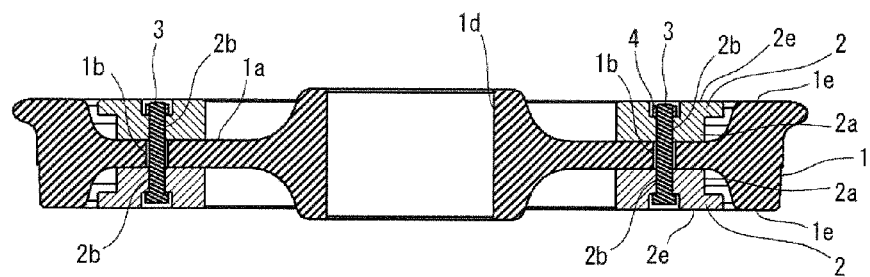
FIG. 1 is a cross-sectional view of an ordinary wheel with discs.
Figure 2:
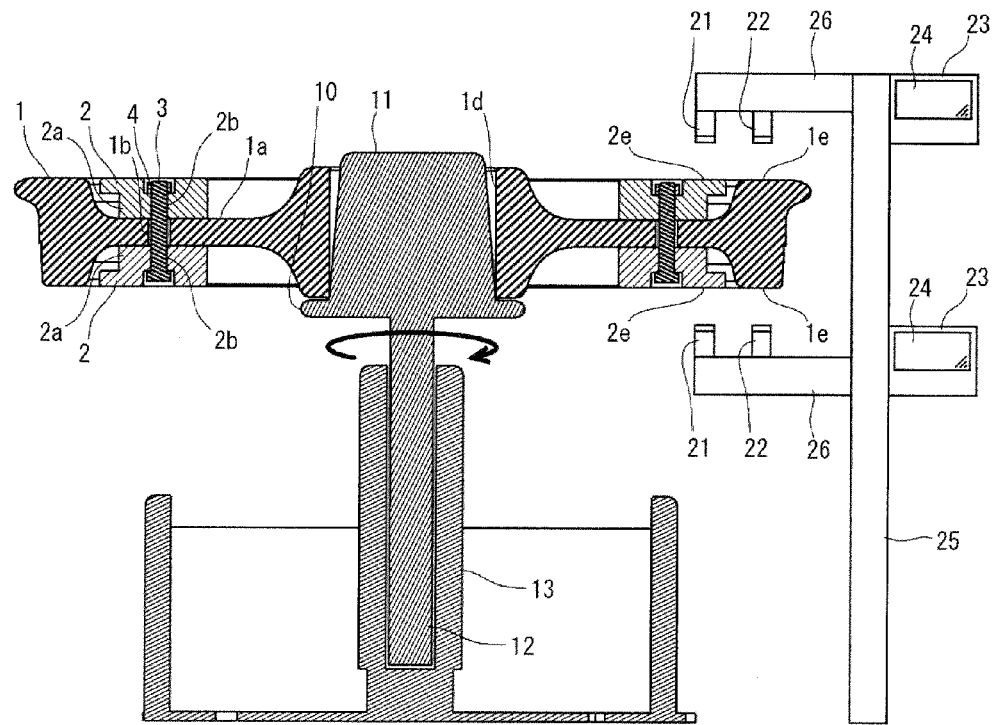
FIG. 2 is a cross-sectional view showing an example of a device for measuring undulation of a brake disc in a wheel with discs according to the present invention.

FIG. 2 is a cross-sectional view showing an example of a device for measuring undulation of a brake disc in a wheel with discs according to the present invention. The undulation measuring device according to the present invention is used when measuring the undulation of a frictional surface of the disc in the wheel with discs shown in FIG. 1, and includes a wheel support 10 that supports the wheel 1.

The wheel support 10 is configured to be able to be driven to rotate about a central axis thereof in a vertical direction. For example, as shown in FIG. 2, a rod-like shaft 12 protrudes from a lower surface of the wheel support 10 along the central axis of the wheel support 10, and this shaft 12 is fitted into a fixed tubular column 13 via a bearing (not shown). Furthermore, rotational drive power is transmitted to the shaft 12 via a gear and a belt from an electric motor (not shown).

Moreover, a columnar portion 11 centering about a central axis thereof protrudes from an upper surface of the wheel support 10. An outer circumferential surface of this columnar portion 11 is tapered to reduce a diameter upward, and a lower end portion of the columnar portion 11 is formed so that a diameter of the lower end portion is approximately equal to or slightly smaller than that of a hub's bore $1d$ of the wheel 1.

The wheel 1 is mounted on the wheel support 10 configured as described above with a surface opposite to a flange of the wheel 1 turned downward and the hub's bore $1d$ fitted into the columnar portion 11. At this time, since the hub's bore $1d$ of the wheel 1, that is, the wheel with discs mounted on the wheel support 10 is fitted into and supported by the columnar portion 11, an own central axis of the wheel with discs almost matches that of the wheel support 10. The wheel with discs can rotate substantially about the central axis of the wheel 1 to follow the rotational driving of the wheel support 10.

In addition, the undulation measuring device according to the present invention includes a pair of displacement gauges 21 and 22 above the wheel with discs supported by the wheel support 10. Specifically, the first displacement gauge 21 is provided to face the frictional surface $2e$ of the disc 2 arranged on the flange side of the wheel 1 (hereinafter, also "flange-side disc 2"), and the second displacement gauge 22 is provided to face the flange-side rim's surface $1e$ of the wheel 1. This pair of the first displacement gauge 21 and the second displacement gauge 22 are connected to a computing unit 23 via wiring (not shown).

The undulation measuring device shown in FIG. 2 also includes a pair of displacement gauges 21 and 22 and the computing unit 23 below the wheel with discs supported by the wheel support 10 similarly to the above. Specifically, the first displacement gauge 21 is provided to face the frictional surface $2e$ of the disc 2 arranged on a side opposite to the flange of the wheel 1 (hereinafter, also "opposite-to-flange disc 2"), and the second displacement gauge 22 is provided to face the opposite-to-flange rim's surface $1e$ of the wheel 1. This pair of the first displacement gauge 21 and the second displacement gauge 22 are connected to the computing unit 23 via wiring (not shown).

While the wheel support 10 is driven to rotate and the wheel with discs goes one round to follow the rotation of the wheel support 10, the upper first displacement gauge 21 measures a height displacement of the frictional surface $2e$ of the flange-side disc 2 for one round, and the upper second displacement gauge 22 measures a height displacement of the flange-side rim's surface $1e$ of the wheel 1 for one round. These measurement data is sequentially transmitted to the upper computing unit 23. In addition to these measurements, the lower first displacement gauge 21 measures a height displacement of the frictional surface $2e$ of the opposite-to-flange disc 2 for one round, and the lower second displacement gauge 22 measures a height displacement of the opposite-to-flange rim's surface $1e$ of the wheel 1 for one round. These measurement data is sequentially transmitted to the lower computing unit 23.

Preferably, non-contact displacement gauges are used as the first displacement gauge 21 and the second displacement gauge 22. This is because it is possible to ensure preventing the rim's surface $1e$ of the wheel 1 and the frictional surface $2e$ of the disc 2 from being inadvertently damaged. For example, it is suitable to use reflective laser displacement sensors as the first displacement sensor 21 and the second displacement sensor 22 for practical use. Furthermore, ultrasonic displacement sensors, eddy-current displacement sensors, or the like may be adopted.

The upper computing unit 23 performs the following processes. The upper computing unit 23 acquires the measurement data sequentially transmitted from the upper first displacement gauge 21, extracts a maximum value (DUmax) and a minimum value (DUmin) of the height displacement of the frictional surface $2e$ of the flange-side disc 2 from the measurement data, and calculates a difference (DU) between this maximum value (DUmax) and this minimum value (DUmin). At the same time, the upper computing unit 23 acquires the measurement data sequentially transmitted from the upper second displacement gauge 22, extracts a maximum value (WUmax) and a minimum value (WUmin) of the height displacement of the flange-side rim's surface $1e$ of the wheel 1 from the measurement data, and calculates a difference (WU) between this maximum value (WUmax) and this minimum value (WUmin). The upper computing unit 23 calculates a difference (DU-WU) between the difference (DU) relating to the frictional surface $2e$ and the difference (WU) relating to the rim's surface $1e$, and derives a value of this difference (DU-WU) as the undulation of the frictional surface 2e of the flange-side disc 2.

Likewise, the lower computing unit 23 performs the following processes. The lower computing unit 23 acquires the measurement data sequentially transmitted from the lower first displacement gauge 21, extracts a maximum value (DBmax) and a minimum value (DBmin) of the height displacement of the frictional surface 2e of the opposite-to-flange disc 2 from the measurement data, and calculates a difference (DB) between this maximum value (DBmax) and this minimum value (DBmin). At the same time, the lower computing unit 23 acquires the measurement data sequentially transmitted from the lower second displacement gauge 22, extracts a maximum value (WBmax) and a minimum value (WBmin) of the height displacement of the opposite-to-flange rim's surface 1e of the wheel 1 from the measurement data, and calculates a difference (WB) between this maximum value (WBmax) and this minimum value (WBmin). The lower computing unit 23 calculates a difference (DB-WB) between the difference (DB) relating to the frictional surface 2e and the difference (WB) relating to the rim's surface 1e, and derives a value of this difference (DB-WB) as the undulation of the frictional surface 2e of the opposite-to-flange disc 2.

The reason for using not only the measurement data from the first displacement gauge 21 that measures the height displacement of the frictional surface 2e of the disc 2 but also the measurement data from the second displacement gauge 22 that measures the height displacement of the rim's surface 1e of the wheel 1 if the undulation of the frictional surface 2e of the disc 2 is to be derived is as follows. It is true that the rim's surface 1e of the wheel 1 is orthogonal to the central axis of the wheel support 10, that is, a rotational axis if the central axis of the wheel support 10 completely matches that of the wheel with discs supported by the wheel support 10. In this case, in the measurement of the undulation of the frictional surface 2e of the disc 2 made while driving the wheel support 10 to rotate, the height displacement of the rim's surface 1e (above-described difference (WU, WB)) for one round is 0 (zero). The undulation of the frictional surface 2e may be measured using only the height displacement of the frictional surface 2e of the disc 2 (above-described difference (DU, DB)) measured by the first displacement gauge 21 and it may be unnecessary to use the second displacement gauge 22.

Actually, however, the wheel with discs supported by the wheel support 10 is possibly supported by the wheel support 10 in a state in which the central axis of the wheel with discs is slightly inclined with respect to the central axis of the wheel support 10. In addition, it is assumed that the rim's surface 1e of the wheel 1 is in an inclined state without being completely orthogonal to the central axis of the wheel support 10, that is, the rotational axis. In this case, in the measurement of the undulation of the frictional surface 2e of the disc 2 made while driving the wheel support 10 to rotate, the height displacement caused by the inclination of the rim's surface 1e is added to the height displacement of the frictional surface 2e of the disc 2 (above-described difference (DU, DB)) measured by the first displacement gauge 21. For this reason, the height displacement caused by the inclination of the rim's surface 1e is measured by the second displacement gauge 22, and the measured height displacement is subtracted from the height displacement of the frictional surface 2e of the disc 2 (above-described difference (DU, DB)) measured by the first displacement gauge 21. It is thereby possible to accurately measure the undulation of the frictional surface 2e.

As shown in FIG. 2, the first displacement gauge 21 and the second displacement gauge 22 are attached to an arm portion 26 protruding horizontally from a column 25, and the computing unit 23 is attached to the column 25. In a stage of mounting the wheel with discs on the wheel support 10 at a time of measuring the undulation, the first displacement gauge 21 and the second displacement gauge 22 are structured to retreat by rotating about the column 25 that serves as a central axis integrally with the arm portion 26, or by horizontally and slidably moving together with the column 25.

In the present embodiment, the upper computing unit 23 includes a display portion 24 and displays a value of the undulation of the frictional surface 2e of the flange-side disc 2 (above-described difference (DU-WU)) on the display portion 24, as shown in FIG. 2. Likewise, the lower computing unit 23 includes the display portion 24 and displays a value of the undulation of the frictional surface 2e of the opposite-to-flange disc 2 (above-described difference (DB-WB)) on the display portion 24. An operator can recognize the undulation of the disc 2 from those values.

The undulation measuring device according to the present invention drives the wheel support 10 that supports the wheel with discs to rotate, and can derive the undulation of the frictional surface 2e of the disc 2 by the use of the computing unit 23 on the basis of the measurement data measured by the first displacement gauge 21 and the second displacement gauge 22 to follow the rotation of the wheel support 10. Therefore, it is possible to swiftly measure the undulation without forcing the operator to have proficient experience and concentration.

Particularly if the pairs of the first displacement gauge 21 and the second displacement gauge 22 are provided above and below the wheel with discs supported by the wheel support 10, that is, the frictional surface side of the flange-side disc 2 that is one of the discs 2 and the frictional surface side of the opposite-to-flange disc 2 that is the other disc 2, respectively as shown in FIG. 2, it is possible to simultaneously measure the undulation of the both discs 2. Owing to this, there is no need to vertically invert the wheel with discs differently from the conventional undulation measuring method, and it is possible to further shorten measurement time and save labor.

As for the measurement time, according to the conventional undulation measuring method, it takes two minutes to measure one of the discs, five minutes to vertically invert the wheel with discs, two minutes to measure the other disc, and five minutes to vertically invert the wheel with discs back to an original state, that is, it takes 14 minutes in total. According to the measurement by means of the undulation measuring device shown in FIG. 2, by contrast, it is possible to sufficient make measurement even at a rotational speed of the wheel support 10 set, for example, to one rpm. In this case, the measurement can be made in quite a short time of about one minute.

If the reflective laser displacement sensor is used as the first displacement sensor 21 in the undulation measuring device according to the present invention, then a spot laser displacement sensor that can measure a one-dimensional displacement by emitting a spot beam may be adopted, and a plurality of these spot laser displacement sensors can be arranged in a line in a radial direction of the discs 2 as the first displacement sensor 21. Furthermore, a two-dimensional laser displacement sensor that can measure a two-dimensional displacement by emitting a line beam may be adopted, and this two-dimensional laser displacement sensor can be arranged so that a beam line is along the radial direction of the discs 2 as the first displacement sensor 21.

In this way, if a plurality of spot laser displacement sensors or the two-dimensional laser displacement sensor is used as the first displacement sensor 21, it is advantageously possible to improve measurement accuracy since the measurement of the undulation of the frictional surface 2e of the disc 2 can be made throughout all areas from an inner circumference side to an outer circumference side of the disc 2. For reference, according to the conventional undulation measuring method, the measurement of the undulation is limited onto a specific circumference with which the gauge head of the dial gauge contacts among the frictional surface 2e of the disc, and there is a limit to the evaluation (measurement) of the value of the undulation.

Moreover, if a plurality of spot laser displacement sensors or the two-dimensional laser displacement sensor is used as the first displacement sensor 21, it is advantageously possible to measure not only the undulation of the disc frictional surface 2e in a circumferential direction but also the undulation of the frictional surface 2e of the disc in a radial direction. As an example of the measurement of the undulation in the radial direction, the computing unit 23 extracts height displacements on the outer circumferential side and the inner circumferential side in the radial direction from the measurement data transmitted from the first displacement sensor 21 (a plurality of spot laser displacement sensors or the two-dimensional laser displacement sensor), and calculates a difference (R). This difference (R) corresponds to the undulation of the frictional surface 2e of the disc in the radial direction. It is thereby possible to measure the undulation of the frictional surface 2e of the disc in the radial direction and recognize such a deformation as a warpage of the disc 2.

It is noted, however, that the undulation of the frictional surface 2e of the disc is measured on the premise that the central axis of the wheel support 10 completely matches that of the wheel with discs supported by the wheel support 10 and that the rim's surface 1e of the wheel 1 is orthogonal to the central axis of the wheel support 10, that is, the rotational axis without inclination. Owing to this, the computing unit 23 calculates the height displacement of the rim's surface 1e of the wheel 1 for one round (the above-described difference (WU, WB)), and measures the undulation of the frictional surface 2e of the disc in the radial direction if this height displacement (difference) is within a specified range, for example, within 0.1 mm that enables the rim's surface 1e to be considered to be orthogonal to the rotational axis. It suffices to measure the undulation again after eliminating factors that cause the excess of the specified range.

Furthermore, the present invention is not limited to the above-described embodiment and various changes can be made of the present invention without departure of the gist of the present invention. For example, in the embodiment described above, the pairs of the first displacement gauge and the second displacement gauge are provided above and below the wheel with discs supported by the wheel support, respectively. Alternatively, the undulation measuring device may be configured so that a pair of the first displacement gauge and the second displacement gauge are provided either above or below for the following reason. Although it is necessary to vertically invert the wheel with discs between the measurements, it is still advantageously possible to relax the constraints on operator's experience and concentration as compared with the measurement by the conventional undulation measuring method.

Moreover, in the embodiment described above, the operator is able to recognize the undulation of the disc by allowing the computing unit to display the undulation value of the frictional surface of the disc on the display unit. Alternatively, the undulation measuring device may be configured so that an undulation management value is registered in the computing unit, and that an alarm is issued if the undulation value derived from the measurement exceeds the management value.

INDUSTRIAL APPLICABILITY

The undulation measuring device according to the present invention can be used effectively for measuring the undulation of a brake disc in a railway wheel with brake discs.

REFERENCE SIGNS LIST

1 railway wheel
1a web of wheel
1b bolt hole of wheel
1d hub's bore of wheel
1e rim's surface of wheel
2 brake disc
2a cooling fin portion of disc
2b bolt hole of disc
2e frictional surface of disc
3 bolt
4 nut
10 wheel support
11 columnar portion
12 shaft
13 tubular column
21 first displacement gauge
22 second displacement gauge
23 computing unit
24 display portion
25 column
26 arm portion

What is claimed is:

1. A device for measuring undulation of a brake disc in a railway wheel with brake discs, a pair of brake discs being arranged to face each other across a web of a railway wheel, the brake disc being fastened to the railway wheel by bolts, the device comprising:

a wheel support supporting a hub's bore of the railway wheel, and rotating about a central axis of the railway wheel;

a first displacement gauge provided to face a frictional surface of one of the brake discs being fastened to the railway wheel by bolts, and measuring a height displacement of the frictional surface for one round to follow rotation of the wheel support;

a second displacement gauge provided to face a rim's surface of the railway wheel on a side of the frictional surface, and measuring a height displacement of the rim's surface for one round to follow the rotation of the wheel support; and a computing unit calculating a first difference between a maximum value and a minimum value of the height displacement of the frictional surface by acquiring measurement data from the first displacement gauge, calculating a second difference between a maximum value and a minimum value of the height displacement of the rim's surface by acquiring measurement data from the second displacement gauge, and deriving a difference between the first difference and the second difference as undulation of the brake disc to the rim's surface of the railway wheel.

2. The device for measuring undulation of a brake disc in a railway wheel with brake discs according to claim 1, wherein pairs of the first displacement gauge and the second displacement gauge are provided on the frictional surface side of one of the brake discs in the railway wheel supported by the wheel support and the frictional surface side of the other brake disc, respectively.

3. The device for measuring undulation of a brake disc in a railway wheel with brake discs according to claim 1, wherein the first displacement gauge and the second displacement gauge are reflective laser displacement sensors.

4. The device for measuring undulation of a brake disc in a railway wheel with brake discs according to claim 2, wherein the first displacement gauge and the second displacement gauge are reflective laser displacement sensors.

* * * * *